United States Patent
Furuhata et al.

(10) Patent No.: US 8,362,854 B2
(45) Date of Patent: *Jan. 29, 2013

(54) FLEXURAL VIBRATION PIECE AND OSCILLATOR USING THE SAME

(75) Inventors: Makoto Furuhata, Matsumoto (JP); Akinori Yamada, Ina (JP); Yuji Hamayama, Tokai (JP)

(73) Assignees: Epson Toyocom Corporation, Tokyo (JP); Seiko Epson Corporation, Tokyo (JP)

( * ) Notice: Subject to any disclaimer, the term of this patent is extended or adjusted under 35 U.S.C. 154(b) by 301 days.

This patent is subject to a terminal disclaimer.

(21) Appl. No.: 12/729,759

(22) Filed: Mar. 23, 2010

(65) Prior Publication Data

US 2010/0244989 A1  Sep. 30, 2010

(51) Int. Cl.
*H03H 9/21* (2006.01)
*H01L 41/04* (2006.01)

(52) U.S. Cl. .......................... 333/200; 310/370

(58) Field of Classification Search .............. 333/186, 333/197, 200; 310/370
See application file for complete search history.

(56) References Cited

U.S. PATENT DOCUMENTS

| 6,587,009 | B2 | 7/2003 | Kitamura et al. | |
| 8,067,880 | B2 * | 11/2011 | Yamada | 310/370 |
| 8,134,283 | B2 * | 3/2012 | Yamada et al. | 310/346 |
| 2010/0013360 | A1 | 1/2010 | Baborowski et al. | |
| 2010/0244973 | A1 * | 9/2010 | Furuhata et al. | 331/158 |

FOREIGN PATENT DOCUMENTS

| JP | U-2-32229 | 2/1990 |
| JP | A-2002-261575 | 9/2002 |
| JP | A-2004-260718 | 9/2004 |
| WO | WO 2008/043727 A1 | 4/2008 |

OTHER PUBLICATIONS

Zener, "Elasticity and Anelasticity of Metals," University of Chicago Press, p. 1.
Zener et al., "Internal Friction in Solids III. Experimental Demonstration of Thermoelastic Internal Friction," Physical Review, vol. 53, Jan. 1, 1938, pp. 100-101.
Roszhart, "The Effect of Thermoelastic Internal Friction on the Q of Micromachined Silicon Resonators," IEEE, pp. 13-16 (1990).
Lifshitz et al., "Thermoelastic Damping in Micro- and Nanomechanical Systems," The American Physical Society, vol. 61, No. 8, pp. 5600-5609 (2000).

(Continued)

*Primary Examiner* — Dean O Takaoka
(74) *Attorney, Agent, or Firm* — Oliff & Berridge, PLC

(57) ABSTRACT

A flexural vibration piece including a vibrator having a first region on which a compressive stress or a tensile stress acts and a second region on which a tensile stress acts when a compressive stress acts on the first region and a compressive stress acts when a tensile stress acts on the first region, and performs flexural vibration in a first plane; and a heat conduction path formed of a material having a thermal conductivity higher than the vibrator and that thermally connects the regions, wherein when m is the number of heat conduction paths, $\rho_{th}$ is the thermal resistivity of the heat conduction path, $\rho_v$ is the thermal resistivity of the vibrator, $t_v$ is the thickness of the vibrator in a direction orthogonal to the first plane, and $t_{th}$ is the thickness of the heat conduction path, a relationship of $t_{th} \geq (1/m) \times t_v \times (\rho_{th}/\rho_v)$ is satisfied.

7 Claims, 7 Drawing Sheets

OTHER PUBLICATIONS

Vigevani et al., "Piezo Thermoelastic Model for Design Optimization of Resonant Beams," IEEE, pp. 1536-1539 (2008).

Hwang et al., "Fabrication of Electrostatically-Actuated, In-Plane Fused Quartz Resonators Using Silicon-On-Quartz (SOQ) Bonding and Quartz Drie," IEEE, pp. 729-732 (2009).

Itoh et al., "Analysis of Q-Value of Quartz Crystal Tuning Fork Using Thermoelastic Coupling Equations," Japanese Journal of Applied Physics, vol. 48, (Jul. 21, 2009).

Muller et al. "Experimental Evidence of Thermoelastic Damping in Silicon Tuning Fork," Procedia Chemistry, pp. 1395-1398 (2009).

* cited by examiner

| MATERIAL NAME | THERMAL RESISTIVITY $\rho$ th (mK/W) |
|---|---|
| SILVER (Ag) | 0.0023 |
| COPPER (Cu) | 0.0025 |
| GOLD (Au) | 0.0032 |
| ALUMINUM (Al) | 0.0042 |
| MOLYBDENUM (Mo) | 0.0072 |
| CHROMIUM (Cr) | 0.0111 |
| TITANIUM (Ti) | 0.0143 |
| PLATINUM (Pt) | 0.0500 |
| DIAMOND (C) | 0.0007 |
| ALUMINUM NITRIDE (AlN) | 0.0035 |
| SILICON (Si) | 0.0068 |
| ZINC OXIDE (ZnO) | 0.0185 |

FIG. 3

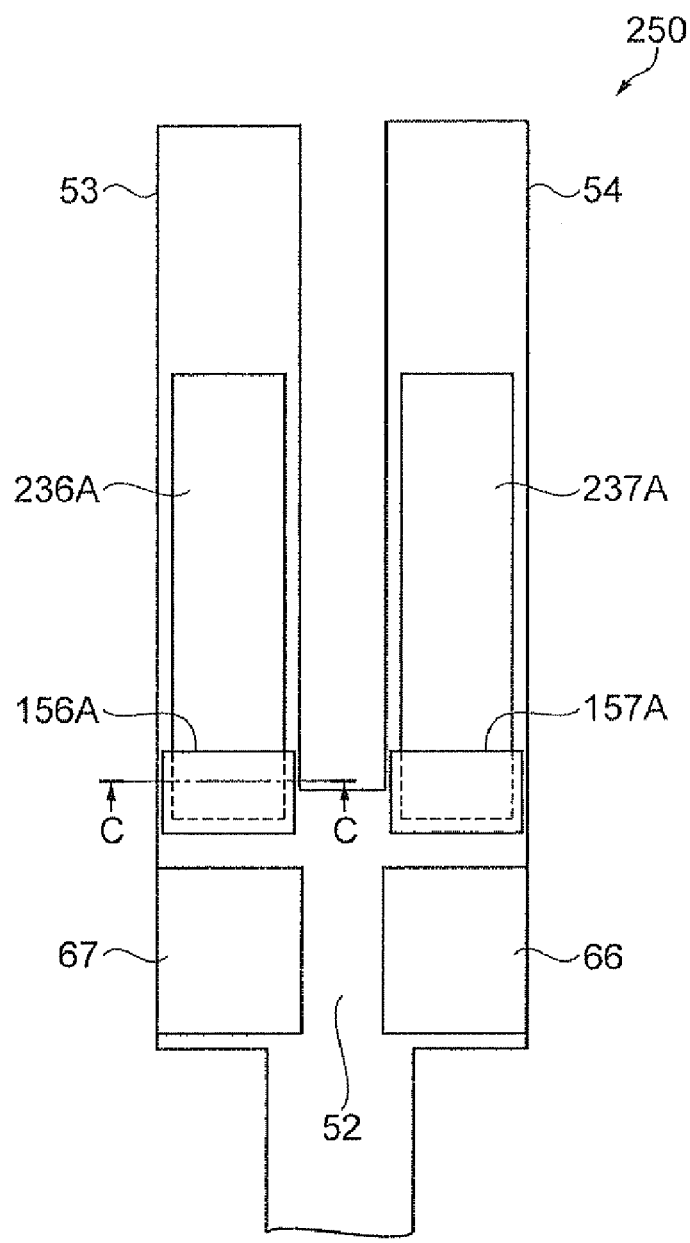
FIG. 5A
FIG. 5B
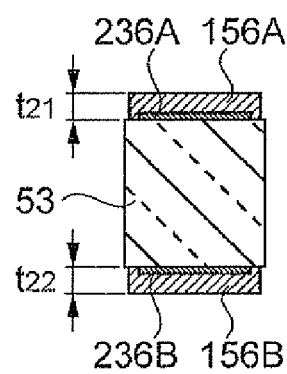

FLEXURAL VIBRATION PIECE AND OSCILLATOR USING THE SAME

BACKGROUND

1. Technical Field

The present invention relates to a flexural vibration piece that vibrates in a flexural mode and an oscillator using the same.

2. Related Art

As a flexural vibration piece that vibrates in a flexural mode in the related art, a tuning fork-type flexural vibration piece has been widely used in which a pair of vibration arms are extended in parallel to each other from a base formed of a base material for a flexural vibrator, such as a piezoelectric material for example, and the vibration arms are caused to horizontally vibrate toward each other and away from each other. When the vibration arms of the tuning fork-type flexural vibration piece are excited, the occurrence of the vibration energy loss causes a reduction in performance of the vibration piece, such as an increase in CI (Crystal Impedance) value or a reduction in Q value. For preventing or decreasing such a vibration energy loss, various measures have been taken in the related art.

For example, a tuning fork-type quartz vibration piece has been known in which a notch or a notch groove having a predetermined depth is formed on both side portions of a base from which vibration arms extend (for example, refer to JP-A-2002-261575 and JP-A-2004-260718). In the tuning fork-type quartz vibration piece, when the vibration of the vibration arms includes also a vertical component, the notch or the notch groove suppresses the leakage of vibration from the base. Therefore, the confinement effect of vibration energy is enhanced to control the CI value and prevent irregularities in CI values between vibration pieces.

In addition to the mechanical vibration energy loss, vibration energy loss is also caused by heat conduction. The heat conduction acts to reduce the temperature difference caused between a compression portion on which a compressive stress of the vibration arms that perform flexural vibration acts and an extension portion on which a tensile stress acts. A reduction in Q value caused by the heat conduction is called a thermoelastic loss effect.

For preventing or suppressing the reduction in Q value due to the thermoelastic loss effect described above, a tuning fork-type vibration piece in which a groove or a hole is formed on the center line of vibration arms (vibration beams) having a rectangular cross section is disclosed in, for example, JP-UM-A-2-32229.

JP-UM-A-2-32229 describes, based on a well-known relational formula between strain and stress in the case of internal friction in solids generally caused by temperature difference, that in the thermoelastic loss in a vibration piece in a flexural vibration mode, the Q value becomes minimum in the case where the number of relaxation oscillations $fm=1/(2\pi\tau)$ (where $\tau$ is a relaxation time) when the number of vibrations changes. The relationship between the Q value and frequency is generally expressed as the curve F in FIG. 8 (for example, refer to C. Zener and other two persons, "Internal Friction in Solids ITT. Experimental Demonstration of Thermoelastic Internal Friction", PHYSICAL REVIEW, Jan. 1, 1938, Volume 53, p. 100-101). In the drawing, the frequency at which the Q value takes a minimum value $Q_0$ is a thermal relaxation frequency $f_0$ ($=1/(2\pi\tau)$), that is, the thermal relaxation frequency $f_0$ is the same as the number of relaxation oscillations fm.

Description will be made specifically with reference to the drawing. In FIG. 7, a tuning fork-type quartz vibration piece 1 of JP-UM-A-2-32229 includes two vibration arms 3 and 4 extending from a base 2 in parallel to each other. The vibration arms 3 and 4 are provided with linear grooves or holes 6 and 7 on the respective center lines. When a predetermined drive voltage is applied to a not-shown excitation electrode disposed on both main surfaces (the same surfaces as those on which the grooves or holes 6 and 7 are formed) of the respective vibration arms 3 and 4 of the tuning fork-type quartz vibration piece 1, the vibration arms 3 and 4 perform flexural vibration toward each other and away from each other as indicated by imaginary lines (two-dot chain lines) and arrows in the drawing.

Due to the flexural vibration, a mechanical strain occurs in regions of root portions of the respective vibration arms 3 and 4 at the base 2. That is, in the root portion of the vibration arm 3 at the base 2, a first region 10 on which a compressive stress or a tensile stress acts due to the flexural vibration and a second region 11 having a relationship in which a tensile stress acts thereon when a compressive stress acts on the first region 10, and a compressive stress acts thereon when a tensile stress acts on the first region 10 are present. In the first region 10 and the second region 11, temperature increases when a compressive stress acts, while temperature decreases when a tensile stress acts.

Similarly to this, in the root portion of the vibration arm 4 at the base 2, a first region 12 on which a compressive stress or a tensile stress acts due to the flexural vibration and a second region 13 having a relationship in which a tensile stress acts thereon when a compressive stress acts on the first region 12, and a compressive stress acts thereon when a tensile stress acts on the first region 12 are present. In the first region 12 and the second region 13, temperature increases when a compressive stress acts, while temperature decreases when a tensile stress acts.

Due to the thus generated temperature gradient, inside the root portions of the respective vibration arms 3 and 4 at the base 2, heat conduction occurs between the first regions 10 and 12 and the second regions 11 and 13. The temperature gradient is generated in opposite directions corresponding to the flexural vibration of the vibration arms 3 and 4, and also the heat conduction changes in direction corresponding thereto. Due to the heat conduction, part of the vibration energy of the vibration arms 3 and 4 is constantly lost during vibration as thermoelastic loss. As a result, the Q value of the tuning fork-type quartz vibration piece 1 decreases to make vibration characteristics unstable, which makes it difficult to realize a desired performance.

In the tuning fork-type quartz vibration piece 1 disclosed in JP-UM-A-2-32229, heat transfer from a compression side to a tensile side is blocked by the grooves or holes 6 and 7 disposed on the respective center lines of the vibration arms 3 and 4, so that the decrease in Q value due to the thermoelastic loss can be prevented or diminished. Specifically, since the heat conduction pathway is bypassed in the flexural vibrator along the grooves or holes 6 and 7 disposed in the respective vibration arms 3 and 4 to be made longer, the thermal relaxation time $\tau$ is extended. Therefore, the thermal relaxation frequency determined by $1/(2\pi\tau)$ is shifted to the left in the drawing, as shown by a relaxation frequency $f_{10}$ of the curve $F_1$ shown in FIG. 8, compared to the curve F and the relaxation frequency $f_0$ of a related-art tuning fork-type flexural vibration piece in which the grooves or holes 6 and 7 are not disposed.

However, in the tuning fork-type quartz vibration piece 1 disclosed in JP-UM-A-2-32229, it becomes difficult to form the grooves or holes along with miniaturization. In addition, an effect of extending the thermal relaxation time due to the grooves or holes is reduced, which causes a problem that an effect of suppressing a reduction in Q value cannot be sufficiently provided.

SUMMARY

An advantage of some aspects of the invention is to solve at least a part of the problem and can be realized as the following aspects or applications.

First Application

A first application of the invention is directed to a flexural vibration piece including: a flexural vibrator that has a first region on which a compressive stress or a tensile stress acts due to vibration and a second region having a relationship in which a tensile stress acts thereon when a compressive stress acts on the first region, and a compressive stress acts thereon when a tensile stress acts on the first region; and a heat conduction path, between the first region and the second region, that is formed of a material having a thermal conductivity higher than that of the flexural vibrator and thermally connects between the first region and the second region, wherein when m is the number of heat conduction paths, $\rho_{th}$ is the thermal resistivity of the heat conduction path, $\rho_v$ is the thermal resistivity of the flexural vibrator, $t_v$ is the thickness of the flexural vibrator in a direction orthogonal to a vibration direction, and $t_{th}$ is the thickness of the heat conduction path in the direction orthogonal to the vibration direction of the flexural vibrator, a relationship of $t_{th} \geq (1/m) \times t_v \times (\rho_{th}/\rho_v)$ is satisfied. In one aspect of the invention, a flexural vibration piece includes: a flexural vibrator that has a first region on which a compressive stress or a tensile stress acts due to vibration and a second region having a relationship in which a tensile stress acts thereon when a compressive stress acts on the first region, and a compressive stress acts thereon when a tensile stress acts on the first region, and performs flexural vibration in a first plane; and a heat conduction path, between the first region and the second region, that is formed of a material having a thermal conductivity higher than that of the flexural vibrator and thermally connects between the first region and the second region, wherein when m is the number of heat conduction paths, $\rho_{th}$ is a thermal resistivity of the heat conduction path, $\rho_v$ is a thermal resistivity of the flexural vibrator, $t_v$ is a thickness of the flexural vibrator in a direction orthogonal to the first plane, and $t_{th}$ is a thickness of the heat conduction path, a relationship of $t_{th} (1/m) \times t_v \times (\rho_{th}/\rho_v)$ is satisfied. In one aspect of the invention, the heat conduction path is formed on an outer surface of the flexural vibration piece.

The present inventor has found that by setting the thickness of the heat conduction path in accordance with the ratio of the heat conduction coefficient between the flexural vibrator and the heat conduction path, and the number of heat conduction paths from the first region to the second region like the above-described configuration, the heat conduction between the first region and the second region is efficiently performed through the heat conduction path. With this setting, since the thermal relaxation time required for the temperature between the first region and the second region reaching a state of equilibrium is shortened, a reduction in Q value can be suppressed.

Moreover, since there is no need to form holes or grooves in the flexural vibrator unlike the related-art measures described above, responding to the miniaturization of the flexural vibration piece is facilitated.

Accordingly, it is possible to provide a small flexural vibration piece in which a reduction in Q value is suppressed and vibration characteristics are stabilized.

Second Application

A second application of the invention is directed to the flexural vibration piece according to the first application of the invention, wherein when fr is the mechanical oscillation frequency of the flexural vibrator, $f_{20}$ is the thermal relaxation frequency of the flexural vibration piece, and $f_0$ is the thermal relaxation frequency of the flexural vibration piece under a condition where the heat conduction path is not disposed, a relationship of $1 > fr/(f_0 + (f_{20} - f_0)/3)$ is satisfied. In one aspect of the invention, when fr is a mechanical oscillation frequency of the flexural vibrator, $f_{20}$ is a thermal relaxation frequency of the flexural vibration piece, $\pi$ is a ratio of the circumference of a circle to its diameter, k is a thermal conductivity of a material used for the flexural vibrator in a vibration direction, $\rho$ is a mass density of the material used for the flexural vibrator, $C_p$ is a heat capacity of the material used for the flexural vibrator, a is a width of the flexural vibrator in the vibration direction, and $f_0 = \pi k/(2\rho C_p a^2)$, a relationship of $1 > fr/(f_0 + (f_{20} f_0)/3)$ is satisfied.

According to the configuration, the Q value higher than that of a flexural vibration piece having the related-art structure is assured, so that it is possible to provide a flexural vibration piece having stable vibration characteristics.

Third Application

A third application of the invention is directed to the flexural vibration piece according to the first application of the invention, wherein when fr is a mechanical oscillation frequency of the flexural vibrator, $\pi$ is a ratio of the circumference of a circle to its diameter, k is a thermal conductivity of a material used for the flexural vibrator in a vibration direction, $\rho$ is a mass density of the material used for the flexural vibrator, $C_p$ is a heat capacity of the material used for the flexural vibrator, a is a width of the flexural vibrator in the vibration direction, and $f_0 = \pi k/(2\rho C_p a^2)$, $1 \geq fr/f_0$.

According to the configuration, it is possible to provide a flexural vibration piece assuring a high Q value and having stable vibration characteristics.

Fourth Application

A fourth application of the invention is directed to the flexural vibration piece of the first application of the invention, wherein the heat conduction path is formed of part of an excitation electrode formed on the flexural vibrator.

According to the configuration, since the excitation electrode is used as the heat conduction path, a flexural vibration piece can be efficiently manufactured.

Fifth Application

A fifth application of the invention is directed to the flexural vibration piece of the first application of the invention, wherein the heat conduction path is formed of a non-conducting material.

According to the configuration, it is also possible to dispose the heat conduction path on the excitation electrode without caring about a short circuit with an electrode such as the excitation electrode. Therefore, the degree of design freedom is increased, which is advantageous for miniaturization. Moreover, the manufacturing is also facilitated.

Sixth Application

A sixth application of the invention is directed to an oscillator at least including: the flexural vibration piece according to the first application of the invention; and an oscillator circuit that drives the flexural vibration piece.

According to the configuration, it is possible to provide a small oscillator having stable oscillation characteristics because the oscillator includes the flexural vibration piece in which a reduction in Q value is suppressed as shown in the first application of the invention.

BRIEF DESCRIPTION OF THE DRAWINGS

The invention will be described with reference to the accompanying drawings, wherein like numbers reference like elements.

FIG. 3 is a table showing exemplary materials applicable to a heat conduction path of the tuning fork-type quartz vibration piece and the thermal resistivities of the materials.

FIG. 5A is a plan view schematically explaining a modification of the tuning fork-type quartz vibration piece.

FIG. 5B is a cross-sectional view taken along line C-C in FIG. 5A.

DESCRIPTION OF EXEMPLARY EMBODIMENTS

Hereinafter, embodiments in which a flexural vibration piece of the invention is embodied in a tuning fork-type quartz vibration piece will be described with reference to the drawings.

First Embodiment

Figure 1:
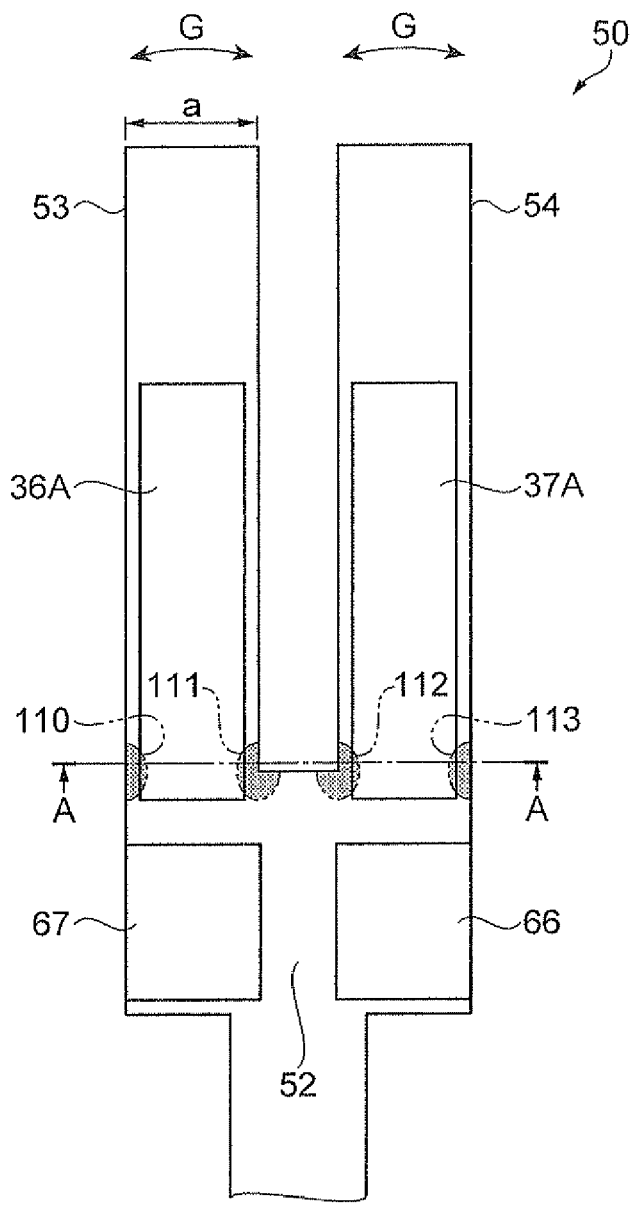
FIG. 1 is a plan view of one main surface side for schematically explaining a tuning fork-type quartz vibration piece as a flexural vibration piece of a first embodiment.
Figure 2:
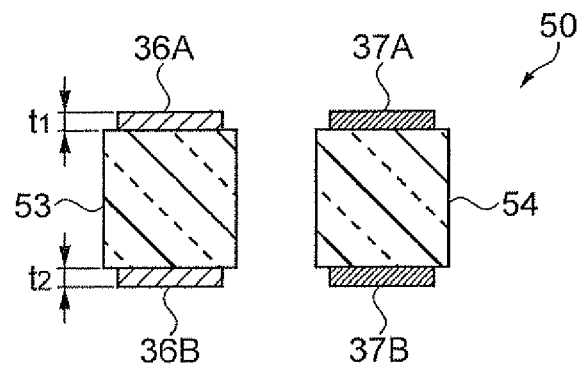
FIG. 2 is a cross-sectional view taken along line A-A in FIG. 1 for schematically explaining the tuning fork-type quartz vibration piece of the first embodiment.

FIGS. 1 and 2 schematically explain a tuning fork-type quartz vibration piece as a flexural vibration piece of a first embodiment. FIG. 1 is a plan view of one main surface side. FIG. 2 is a cross-sectional view taken along line A-A in FIG. 1.

In FIG. 1, a tuning fork-type quartz vibration piece 50 of the embodiment is formed to have a so-called tuning fork-type external shape with a base 52 that is formed by processing a flexural vibrator material and a pair of vibration arms 53 and 54 bifurcated from one end side (an upper end side in the drawing) of the base 52 and extending in parallel to each other. As the flexural vibrator material, a material cut out from a single crystal of quartz is used in the embodiment in the same manner as in a related-art tuning fork-type quartz vibration piece. For example, the material is formed from a so-called Z-cut quartz thin plate with the Y-axis of crystal axis of quartz being directed to a longitudinal direction of the vibration arms 53 and 54, the X-axis being directed to a width direction of the vibration arms, and the Z-axis being directed to a vertical direction of the front and rear main surfaces of the vibration piece. The tuning fork-type external shape of the tuning fork-type quartz vibration piece 50 can be precisely formed by wet etching with hydrofluoric acid solution or dry etching a quartz substrate material such as a quartz wafer, for example.

A configuration may be adopted in which a piezoelectric substrate other than the quartz substrate is used as the flexural vibrator material. For example, an oxide substrate such as of aluminum nitride (AlN), lithium niobate (LiNbO$_3$), lithium tantalate (LiTaO$_3$), lead zirconate titanate (PZT), or lithium tetraborate (Li$_2$B$_4$O$_7$) and a piezoelectric substrate configured by stacking a thin-film piezoelectric material such as aluminum nitride or tantalum pentoxide (Ta$_2$O$_5$) on a glass substrate can be used. Moreover, the flexural vibration piece can be formed of, for example, a silicon semiconductor material in addition to the piezoelectric substrate.

However, the resonant frequency of a flexural vibration piece is proportional to the square root of a value obtained by dividing the Young's modulus of a flexural vibrator material by the mass density. Therefore, as the value obtained by dividing the Young's modulus by the mass density is smaller, the material is more advantageous for miniaturizing the flexural vibration piece. Accordingly, a flexural vibration piece made of quartz like the tuning fork-type quartz vibration piece 50 of the embodiment is advantageous for miniaturization because the square root of the value obtained by dividing the Young's modulus by the mass density can be made smaller compared to a silicon semiconductor material or the like. In addition, the flexural vibration piece made of quartz is excellent in frequency-temperature characteristics. Therefore, the flexural vibration piece made of quartz is particularly preferable as a material used for the tuning fork-type quartz vibration piece 50 as the flexural vibration piece of the embodiment.

Excitation electrodes 36A and 37A are formed on one main surfaces of the respective vibration arms 53 and 54. In the vicinity of the other end side of the base 52 different from the one end side from which the vibration arms 53 and 54 are extended, external connection electrodes 66 and 67 serving for external connection are disposed. The external connection electrodes 66 and 67 respectively correspond to the excitation electrodes 36A and 37A. The electrodes corresponding to each other are connected to each other with a not-shown routing wire routed on the main surface and side surface of the tuning fork-type quartz vibration piece 50.

Similarly, as shown in FIG. 2, on the other main surfaces of the respective vibration arms 53 and 54, excitation electrodes 36B and 37B as counter electrodes of the respective excitation electrodes 36A and 37A are respectively disposed in the vibration arms 53 and 54. The excitation electrodes 36B and 37B are connected to the respectively corresponding electrodes such as the excitation electrodes 36A and 37A or the external connection electrodes 66 and 67 with a not-shown routing wire routed on the main surface and side surface of the tuning fork-type quartz vibration piece 50.

In this case, the excitation electrodes 36A and 36B of the vibration arm 53 have the same potential, and the excitation electrodes 37A and 37B of the vibration arm 54 have the same potential. The excitation electrodes 36A and 36B and the excitation electrodes 37A and 37B of the respective vibration arms 53 and 54 have different potentials.

In the tuning fork-type quartz vibration piece 50 of the embodiment, the excitation electrodes 36A, 36B, 37A, and 37B are used as heat conduction paths that thermally connect between first regions 110 and 112 and second regions 111 and 113, which will be described in detail below, in the vicinities of the root portions of the vibration arms 53 and 54 at the base 52. Therefore, the excitation electrodes 36A, 36B, 37A, and 37B are formed to a range covering the first regions 110 and 112 and the second regions 111 and 113.

Although not shown in the drawings for the convenience of easily describing the features of the tuning fork-type quartz vibration piece 50 of the embodiment, excitation electrodes respectively having the same potentials as that of the excitation electrodes 36A and 36B and that of the excitation electrodes 37A and 37B of the vibration arms 53 and 54 are formed on both side surfaces of the respective vibration arms 53 and 54 orthogonal to both the main surfaces on which the excitation electrodes 36A, 36B, 37A, and 37B are formed.

The above-described electrodes and wires can be formed in the related art as follows. After etching quartz to form the external shape of the tuning fork-type quartz vibration piece 50, an electrode layer of gold (Au), for example, is deposited by deposition or sputtering on an under layer of nickel (Ni) or chromium (Cr), for example. Thereafter, the electrode layer is patterned by photolithography. However, in the tuning fork-type quartz vibration piece 50 of the embodiment, parts of the excitation electrodes 36A, 36B, 37A, and 37B are used as the heat conduction paths as described above. Therefore, a metal material that has a sufficiently low thermal resistivity and is effective as a heat conduction path is selected for use as will be described in detail below.

Here, the heat conduction path that serves particularly as an essential part in the configuration of the tuning fork-type quartz vibration piece 50 of the embodiment will be described in detail.

FIG. 2 shows a cross section of the tuning fork-type quartz vibration piece 50 in FIG. 1 taken along line A-A, that is, cross sections of the respective vibration arms 53 and 54 in the vicinities of the root portions at the base 52. In the embodiment, the excitation electrodes 36A, 36B, 37A, and 37B in the vicinities of the root portions of the vibration arms 53 and 54 at the base 52 are used as the heat conduction paths for suppressing thermoelastic loss to prevent the deterioration of the Q value, which will be described later. The "heat conduction path" used herein indicates each of heat conduction pathways between the first regions 110 and 112 and the second regions 111 and 113 that are regions (indicated by two-dot chain lines) in the vicinities of the root portions of the respective vibration arms 53 and 54 at the base 52 positioned in a flexural vibration direction indicated by arrows G in the tuning fork-type quartz vibration piece 50 shown in FIG. 1.

Returning to FIG. 2, in the vicinity of the root portion of the vibration arm 53 at the base 52, the excitation electrode 36A disposed on one main surface of the vibration arms 53 has a thickness $t_1$. The excitation electrode 36B disposed on the other main surface of the vibration arm 53 has a thickness $t_2$.

Similarly, the excitation electrode 37A disposed on one main surface of the vibration arm 54 has the thickness $t_1$, and the excitation electrode 37B disposed on the other main surface of the vibration arm 54 has the thickness $t_2$. In the tuning fork-type quartz vibration piece 50 of the embodiment, $t_1$ equals $t_2$.

As the material of the excitation electrodes 36A, 36B, 37A, and 37B used as the heat conduction paths in the embodiment, a material having a thermal resistivity at least lower than that of quartz as the flexural vibrator material and as low as possible is used. The material is selected in view of relative easiness of availability, low cost, easiness of manufacturing, and the like, in addition to the thermal resistivity. For example, FIG. 3 shows exemplary materials applicable to the heat conduction path (part of the excitation electrode in the embodiment). It is preferable to use a material having a lower thermal resistivity among the materials of FIG. 3 because the thickness of the heat conduction path can be made smaller. In the embodiment, since parts of the excitation electrodes 36A, 36B, 37A, and 37B are used as the heat conduction paths, it is naturally necessary to use a conducting material that can serve as an electrode. Therefore, diamond that is a non-conducting substance in the drawing is not applicable. However, when a heat conduction path is formed separately from an electrode such as the excitation electrode as in another embodiment described later, conductivity is not required for the material of the heat conduction path. Therefore, a non-conductive material having a relatively low thermal resistivity, such as diamond in the drawing, can be properly used.

The present inventor has found in the above-described configuration that an effect of suppressing a reduction in Q value, described later, is provided by satisfying a relationship of $t_{th} \geq (1/m) \times t_v \times (\rho_{th}/\rho_v)$ when m is the number of heat conduction paths of the flexural vibrator, $\rho_{th}$ is the thermal resistivity of the heat conduction path, $\rho_v$ is the thermal resistivity of the flexural vibrator, $t_v$ is the thickness of the flexural vibrator in a direction orthogonal to a vibration direction, and $t_{th}$ is the thickness of the heat conduction path in the direction orthogonal to the vibration direction of the flexural vibrator. That is, by satisfying the condition, it is possible to avoid an unfavorable state in which heat conducts more easily in the flexural vibrator (quartz in the embodiment) than in parts of the excitation electrodes 36A, 36B, 37A, and 37B as the heat conduction paths. It is preferable to satisfy a relationship of $t_{th} > (1/m) \times t_v \times (\rho_{th}/\rho v)$. With this condition, it is possible to reliably realize a state in which heat conducts more easily in the heat conduction path than in the flexural vibrator (quartz in the embodiment), so that the improvement of the Q value caused by shortening the thermal relaxation time is reliably achieved. In the embodiment, the thickness $t_{th}$ corresponds to the thickness $t_1$ and the thickness $t_2$ of the parts of the excitation electrodes 36A, 36B, 37A, and 37B used as the heat conduction paths. The "number m" of heat conduction paths indicates the number of heat conduction paths that thermally connect between the first region and the second region in each of the flexural vibrators having the first region and the second region.

In the embodiment for example, since respective parts of the excitation electrodes 36A and 37A on one main surface and respective parts of the excitation electrodes 36B and 37B on the other main surface in the respective vibration arms 53 and 54 are used as the heat conduction path, the number m of heat conduction paths is two.

In the tuning fork-type quartz vibration piece of the embodiment, when Z-cut quartz (thermal resistivity $\rho_v$=0.1613 mK/W) with the thickness $t_v$ in a direction orthogonal to the vibration direction of the vibration arms 53 and 54 being 100 μm is used for a quartz substrate as the flexural vibrator, and the excitation electrode (heat conduction path) is formed by using gold (Au: thermal resistivity $\rho_{th}$=0.0032 mK/W) among the materials shown in FIG. 3, the thickness $t_1$ or $t_2$ of at least the parts of the excitation electrodes 36A, 363, 37A, and 373 used as the heat conduction paths may be 1 μm or more because it is sufficient to satisfy the relationship of the formula $t_{th} \geq (1/m) \times t_v \times (\rho_{th}/\rho_v)$.

The embodiment has described a configuration in which the parts of the excitation electrodes 36A, 36B, 37A, and 37B that are adjusted to have the thickness $t_1$ or $t_2$ are used as the heat conduction paths as shown in FIG. 2. However, it is sufficient to adjust the thickness of at least the parts of the excitation electrodes 36A, 36B, 37A, and 37B used as the heat conduction paths to the thickness $t_1$ or $t_2$. For example, a step of masking a part different from the part used for the heat conduction path to deposit a material for the excitation electrode is included in a step of forming the excitation electrode, so that the electrode forming material can be deposited thick only at the part used as the heat conduction path, and the use amount of the electrode forming material in the other part can be reduced.

In FIG. 1, when a drive voltage is applied from an oscillator circuit (not shown) as exciting means connected to the outside to the excitation electrodes 36A and 36B and the excitation electrodes 37A and 37B in the tuning fork-type quartz vibration piece 50, the vibration arms 53 and 54 horizontally perform flexural vibration toward each other and away from each other as indicated by the arrows G in the drawing. In the embodiment, it can be said that the base 52 and the vibration arms 53 and 54 are formed on a predetermined first plane, and that the vibration arms 53 and 54 perform flexural vibration in the first plane.

Due to the flexural vibration, in the connections between the base 52 and the respective vibration arms 53 and 54, a compressive stress and a tensile stress occur in the regions of the root portions of the respective vibration arms 53 and 54 in the vibration direction. That is, a compressive stress and a tensile stress occur in the first region 110 and the second region 111 of the vibration arm 53 in the drawing. Similarly to this, a compressive stress and a tensile stress occur also in the region of the connection of the vibration arm 54 with the base 52 (described in detail later). Description will be made in detail on the vibration arm 53 side in the drawing. When a free end side of the vibration arm 53 performs flexural vibration toward the vibration arm 54, a tensile stress acts on the first region 110 of the vibration arm 53 to decrease temperature, and a compressive stress acts on the second region 111 to increase temperature. Conversely, when the free end side of the vibration arm 53 bends away from the vibration arm 54, a compressive stress acts on the first region 110 to increase temperature, and a tensile stress acts on the second region 111 to decrease temperature.

Similarly, when a free end side of the vibration arm 54 performs flexural vibration toward the vibration arm 53, a tensile stress acts on the first region 112 of the vibration arm 54 to decrease temperature, and a compressive stress acts on the second region 113 to increase temperature. Conversely, when the free end side of the vibration arm 54 bends away from the vibration arm 53, a compressive stress acts on the first region 112 to increase temperature, and a tensile stress acts on the second region 113 to decrease temperature.

In this manner, inside the connections of the respective vibration arms 53 and 54 with the base 52, a temperature gradient is generated between the portion on which a compressive stress acts and the portion on which a tensile stress acts. The gradient changes in direction depending on the vibration direction of the vibration arms 53 and 54.

Due to the temperature gradient, heat conducts from the portion on the compression side to the portion on the tensile (extension) side, that is, from the high-temperature side to the low-temperature side. In the tuning fork-type quartz vibration piece 50 of the embodiment, the heat conduction from the portion on the compression side to the portion on the extension side is performed by using parts of the excitation electrodes 36A and 36B and the excitation electrodes 37A and 37B of the respective vibration arms 53 and 54 as the heat conduction paths.

Description will be made in detail on one main surface side of the tuning fork-type quartz vibration piece 50 shown in FIG. 1. Parts (vicinities of the root portions of the respective vibration arms 53 and 54 at the base 52) of the excitation electrodes 36A and 37A respectively disposed on the vibration arms 53 and 54 are arranged so as to thermally connect between the first regions 110 and 112 and the second regions 111 and 113 of the vibration arms 53 and 54. Since the electrode forming material of the excitation electrodes 36A and 37A has a thermal resistivity lower than that of a quartz substrate as the flexural vibrator as described above, heat is conducted between the first regions 110 and 112 and the second regions 111 and 113 using the regions of the excitation electrodes 36A and 37A that thermally connect between the first regions 110 and 112 and the second regions 111 and 113 as the heat conduction paths.

In this manner, the excitation electrodes 36A, 36B, 37A, and 378, the parts of which are used as the heat conduction paths, are configured of a material having a thermal resistivity at least lower than that of quartz as the flexural vibrator, and the thickness $t_{th} \geq (t_1$ or $t_2$ in FIG. 2) in the direction orthogonal to the vibration direction of the vibration arms 53 and 54 is adjusted so as to satisfy the relationship of $t_{th} \geq (1/m) \times t_v \times (\rho_{th}/\rho_v)$ as described above. This makes the time for heat conduction from the compression side to the extension side faster than in the case of a related-art structure in which the flexural vibration piece serves as a heat conduction pathway between the first region and the second region. That is, a relaxation time $\tau_1$ required for the temperature reaching a state of equilibrium between the first regions 110 and 112 and the second regions 111 and 113 when the vibration arms 53 and 54 perform flexural vibration is shorter than a relaxation time $\tau_0$ of the related-art structure in which the heat conduction path is not disposed. That is, since $\tau_1 < \tau_0$ is established in a thermal relaxation frequency $f_{20}=1/(2\pi\tau_1)$ of the tuning fork-type quartz vibration piece 50 of the embodiment, the thermal relaxation frequency $f_{20}$ is higher than a thermal relaxation frequency $f_0=1/(2\pi\tau_0)$ of the tuning fork-type quartz vibration piece having the related-art structure.

It is generally known that the thermal relaxation frequency $f_0$ is determined by the following equation (1):

$$f_0 = \pi k/(2\rho C_p a^2) \qquad (1)$$

where π is the ratio of the circumference of a circle to its diameter, k is the thermal conductivity of a vibration arm (flexural vibrator) in the flexural vibration direction, ρ is the mass density of the vibration arm (flexural vibrator), $C_p$ is the heat capacity of the vibration arm (flexural vibrator), and a is the width of the vibration arm (flexural vibrator) in the flexural vibration direction. When constants of a material itself of the vibration arm are input to the thermal conductivity k, mass density ρ, and heat capacity $C_p$ of the equation (1), the thermal relaxation frequency $f_0$ to be determined is a relaxation oscillation frequency of a flexural vibrator in which the heat conduction paths that thermally connect between the first regions 110 and 112 and the second regions 111 and 113 are not disposed.

Figure 8:
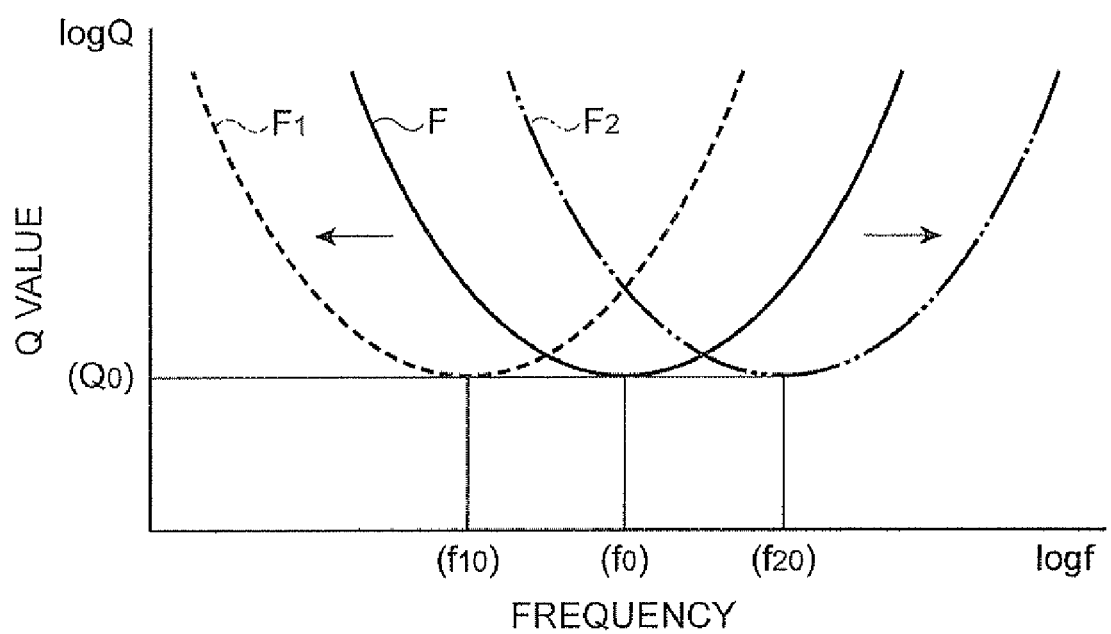
FIG. 8 is a graph showing the relationship between the relaxation frequency and minimum Q value in a flexural vibration piece in a flexural vibration mode.

In terms of the relationship between the mechanical oscillation frequency (resonant frequency) and Q value of the vibration arm in FIG. 8, since the shape of the curve F itself is not changed, the curve F is shifted to the position of the curve $F_2$ in a frequency increasing direction (right direction on the paper surface) along with an increase in thermal relaxation frequency. Accordingly, in a range in which fr is equal to or less than the thermal relaxation frequency $f_0$, that is, in a range satisfying a relationship of 1 fr/$f_0$ when fr is the mechanical oscillation frequency (resonant frequency) of the vibration arm, the Q value on the curve $F_2$ is always higher than that on the curve F of the related-art structure. In addition, also in a frequency band at a frequency lower than that at an intersection of the curve F and the curve $F_2$, that is, in a range satisfying a relationship of $1 > fr/(f_0 + (f_{20} - f_0)/3)$ on the curve $F_2$, the Q value is higher than that on the curve F of the tuning fork-type quartz vibration piece having the related-art structure. In this manner, in the tuning fork-type quartz vibration piece 50 of the embodiment, the heat conduction paths (parts of the excitation electrodes 36A, 36B, 37A, and 37B) that thermally connect between the first regions 110 and 112 and the second regions 111 and 113 of the vibration arms 53 and 54 have a low thermal resistivity, and the thickness thereof is managed. Therefore, it is possible to improve the Q value and realize high performance.

In the embodiment, parts of the excitation electrodes 36A, 36B, 37A, and 373 are used as the heat conduction paths. With this configuration, it is possible to simplify the manufacturing process and take measures for stabilizing the Q value with high space efficiency. Therefore, the configuration is advantageous for the miniaturization and low cost of the tuning fork-type quartz vibration piece 50.

Second Embodiment

In the first embodiment, parts of the excitation electrodes 36A, 36B, 37A, and 37B of the tuning fork-type quartz vibration piece 50 are used as the heat conduction paths. This is not restrictive, and a heat conduction path may be disposed separately from the excitation electrode on the flexural vibrator.

Figure 4A:
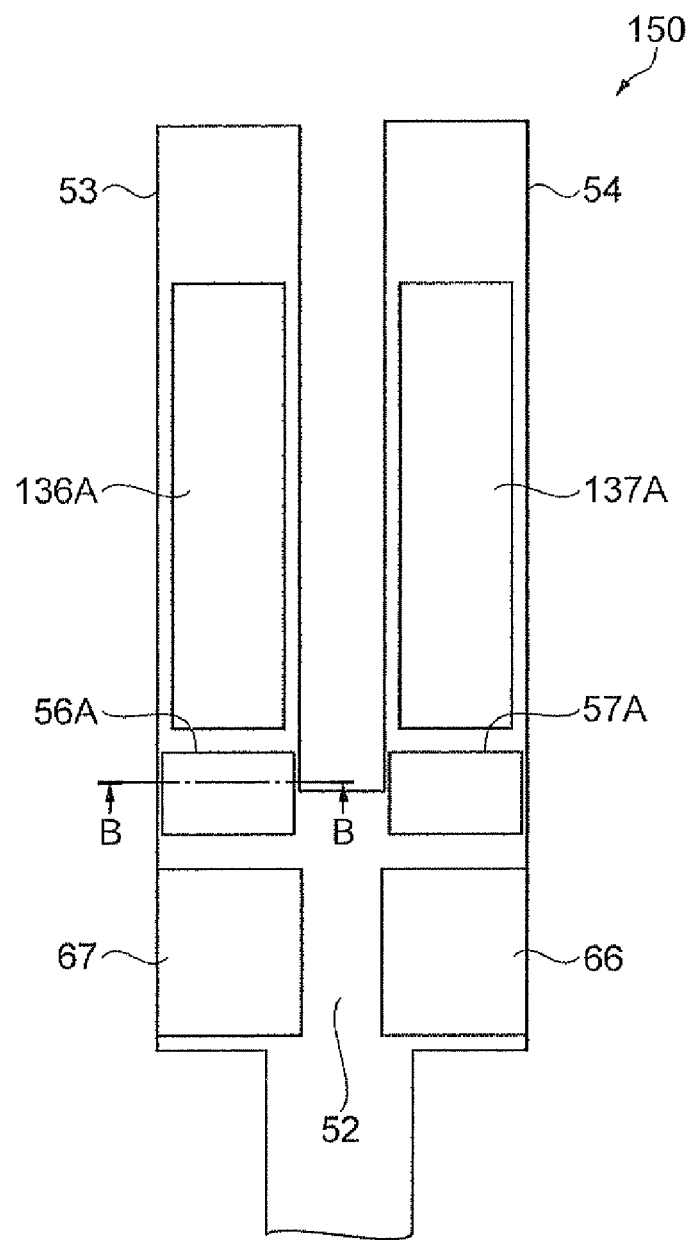
FIG. 4A is a plan view for schematically explaining a tuning fork-type quartz vibration piece of a second embodiment.
Figure 4B:
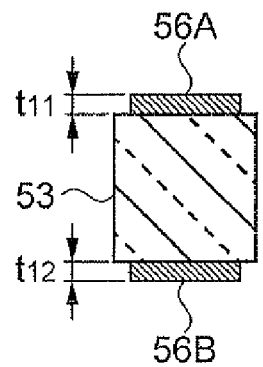
FIG. 4B is a cross-sectional view taken along line B-B in FIG. 4A.

FIGS. 4A and 4B schematically explain a tuning fork-type quartz vibration piece in which heat conduction paths are disposed separately from excitation electrodes on the flexural vibrator. FIG. 4A is a plan view of one main surface side, and FIG. 4B is a cross-sectional view taken along line B-B in FIG. 4A. In FIGS. 4A and 4B of a second embodiment, the same constituent as in the first embodiment is denoted by the same reference numeral, and the description thereof is omitted.

In FIG. 4A, a tuning fork-type quartz vibration piece 150 of the second embodiment has a tuning fork-type external shape with the base 52 formed of a flexural vibrator material and the pair of vibration arms 53 and bifurcated from one end side of the base 52 and extending in parallel to each other. On one main surfaces of the respective vibration arms 53 and 54, excitation electrodes 136A and 137A are formed. In the vicinity of the other end side of the base 52 different from the one end side from which the vibration arms 53 and 54 are extended, the external connection electrodes and 67 are disposed. The external connection electrodes 66 and 67 respectively correspond to the excitation electrodes 136A and 137A. The electrodes corresponding to each other are connected to each other with a not-shown routing wire routed on the main surface and side surface of the tuning fork-type quartz vibration piece 150.

Although not shown in the drawings, excitation electrodes respectively having the same potentials as that of the excitation electrodes 136A and 136B and that of the excitation electrodes 137A and 137B of the vibration arms 53 and 54 are formed on both side surfaces of the respective vibration arms 53 and 54 orthogonal to both the main surfaces on which the excitation electrodes 136A, 136B, 137A, and 137B are formed.

On one main surface side of the vibration arm 53 on which the excitation electrode 136A is formed, a heat conduction path 56A is disposed at a position where the first region and the second region (refer to FIG. 1) are thermally connected to each other as described in the first embodiment in the vicinity of the root portion of the vibration arm 53 at the base 52. The heat conduction path 56A is formed of a material (refer to FIG. 3) having a thermal resistivity lower than that of a quartz substrate as the flexural vibrator.

Similarly, on one main surface side of the vibration arm 54 on which the excitation electrode 137A is formed, a heat conduction path 57A is deposed at a position where the first region and the second region are thermally connected to each other in the vicinity of the root portion of the vibration arm 54 at the base 52.

As shown in FIG. 4B, a heat conduction path 56B is disposed at a position facing the heat conduction path 56A on the other main surface side of the vibration arm 53.

In this case, the heat conduction paths 56A and 56B disposed on both the main surfaces of the vibration arm 53 are formed such that the heat conduction paths 56A and 56B are adjusted to have thicknesses $t_{11}$ and $t_{12}$ ($t_{11} = t_{12}$ the second embodiment) having the same definition as the thickness $t_{th}$ of the heat conduction path described in the first embodiment.

Similarly to this, a heat conduction path (not shown) having the thickness $t_{12}$ is disposed at a position facing the heat conduction path 57A having the thickness $t_{11}$ on the other main surface side of the vibration arm 54.

According to the configuration, it is not necessary to consider a function of the excitation electrodes 136A, 137A, and the like as an electrode material, and the choices of material used as the heat conduction paths 56A, 56B, and 57A are increased. Therefore, it is possible to more effectively stabilize the Q value of the tuning fork-type quartz vibration piece 150 and improve the manufacturing efficiency thereof. For example, the heat conduction paths 56A, 56B, and 57A that are formed relatively thick are formed only by controlling the thickness of the heat conduction paths 56A, 56B, and 57A regardless of the thickness of the excitation electrodes 136A and 137A. Therefore, a waste of material is reduced, and the control of the thickness can be performed with high precision.

Moreover, conductivity is not required for the heat conduction paths 56A, 56B, and 57A that are formed separately from the excitation electrodes 136A and 137A. Therefore, a non-conducting material having a low thermal resistivity, such as diamond, can be selected among the materials shown in FIG. 3, for example, to suppress a reduction in Q value more effectively.

The tuning fork-type quartz vibration piece as the flexural vibration piece described in the embodiment can be implemented as the following modification.

Modification

In the tuning fork-type quartz vibration piece 150 of the second embodiment, the heat conduction paths 56A, 56B, and 57A are disposed at a position not overlapping an electrode such as the excitation electrodes 136A and 137A. However, when a non-conducting material is used as the forming material of the heat conduction path, the heat conduction path can be overlapped with an electrode, so that an effect of miniaturization or the like is provided.

FIGS. 5A and 5B schematically explain a tuning fork-type quartz vibration piece of a modification. FIG. 5A is a plan view of one main surface side, and FIG. 5B is a cross-sectional view taken along line C-C in FIG. 5A.

In FIG. 5A, a tuning fork-type quartz vibration piece 250 of the modification has a tuning fork-type external shape with the base 52 formed of a flexural vibrator material and the pair of vibration arms 53 and bifurcated from one end side of the base 52 and extending in parallel to each other. On one main surfaces of the respective vibration arms 53 and 54, excitation electrodes 236A and 237A disposed in regions including the vicinity of the root portions of the respective vibration arms 53 and 54 at the base 52 are formed.

On one main surface side of the vibration arm 53 on which the excitation electrode 236A is formed, a heat conduction path 156A is disposed at a position where the first region and the second region (refer to FIG. 1) are thermally connected to each other as described in the first embodiment in the vicinity of the root portion of the vibration arm 53 at the base 52. The heat conduction path 156A is formed of a non-conductor among materials (for example, refer to FIG. 3) having a thermal resistivity lower than that of a quartz substrate as the flexural vibrator. Although the heat conduction path 156A is disposed in a region including the upper surface of the excitation electrode 236A, an electrical failure such as a short circuit can be prevented because the heat conduction path 156A is a non-conductor.

Similarly, on one main surface side of the vibration arm 54 on which the excitation electrode 237A is formed, a heat conduction path 157A is disposed at a position where the first region and the second region are thermally connected to each other in the vicinity of the root portion of the vibration arm 54 at the base 52.

As shown in FIG. 5B, a heat conduction path 156B is disposed at a position facing the heat conduction path 156A on the other main surface side of the vibration arm 53.

The heat conduction paths 156A and 156B disposed on both the main surfaces of the vibration arm 53 are formed such that the heat conduction paths 156A and 156B are adjusted to have thicknesses $t_{21}$ and $t_{22}$ ($t_{21}=t_{22}$ in this case) having the same definition as the thickness $t_{th}$ of the heat conduction path described in the first embodiment.

Similarly to this, a heat conduction path (not shown) having the thickness $t_{22}$ is disposed at a position facing the heat conduction path 157A having the thickness $t_{21}$ on the other main surface side of the vibration arm 54.

Although not shown in the drawings, excitation electrodes respectively having the same potentials as that of the excitation electrodes 236A and 236B and that of the excitation electrodes 237A and 237B of the vibration arms 53 and 54 are formed on both side surfaces of the vibration arms 53 and 54 orthogonal to both the main surfaces on which the excitation electrodes 236A, 236B, 237A, and 237B are formed.

According to the configuration, the heat conduction paths 156A, 156B, and 157A can be disposed on the excitation electrodes 236A, 236B, and 237A without caring about a short circuit with an electrode such as the excitation electrodes 236A, 236B, and 237A. Therefore, the degree of design freedom is increased, which is advantageous for miniaturization. Moreover, the accuracy of forming position of the electrodes with respect to the heat conduction paths 156A, 156B, and 157A can be reduced for example, which facilitates manufacturing.

Oscillator

The tuning fork-type quartz vibration pieces 50, 150, and 250 as flexural vibration pieces described in the first and second embodiments and the modification can be applied to piezoelectric devices or various electronic components other than piezoelectric devices. Especially an oscillator configured by at least incorporating into a package, together with any flexural vibration piece of the tuning fork-type quartz vibration pieces 50, 150, and 250, an oscillator circuit element that oscillates the flexural vibration piece can realize high performance because of an improvement in Q value and can achieve miniaturization.

Although the embodiments of the invention made by the inventor have been specifically described so far, the invention is not restricted to the above-described embodiments. Various changes can be added in a range not departing from the gist of the invention.

For example, in the tuning fork-type quartz vibration pieces 50, 150, and 250 of the first and second embodiments and modification, the heat conduction paths 36, 37, 56, 57, 156, and 157 are disposed on both the main surfaces of the respective vibration arms 53 and 54. That is, in the formula $t_{th} \geq (1/m) \times t_v \times (\rho_{th}/\rho_v)$ defining the thickness $t_{th}$ ($t_1$ and $t_2$) of the heat conduction paths 36 and 37 described in the first embodiment, the number m of heat conduction paths is two, but this is not restrictive. Even when the number of heat conduction paths is one or three in each flexural vibrator (vibration arm of the tuning fork-type quartz vibration piece), it is sufficient to assure the thickness of each heat conduction path so as to satisfy the relationship of the formula.

In the first and second embodiments and the modification, the tuning fork-type quartz vibration pieces 50, 150, and 250 as flexural vibration pieces have been described. However, this is not restrictive. The flexural vibration piece of the invention may be a so-called beam type flexural vibration piece having a reed shape. Moreover, even when a flexural vibration piece having three or more vibration arms can provide the same effect as in the first and second embodiments and the modification.

Figure 6A:
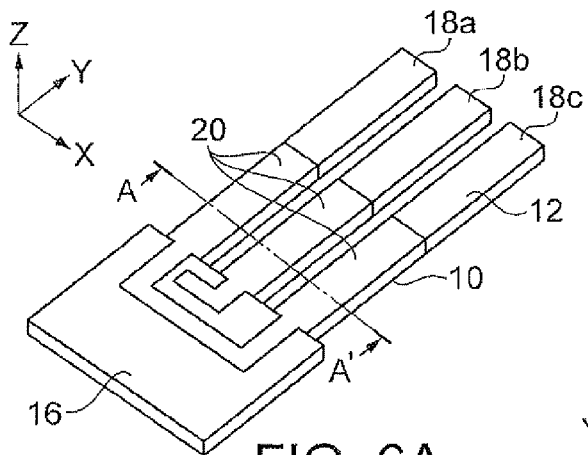
FIG. 6A is a perspective view for schematically showing a flexural vibration piece having three vibration arms and showing a process of electrode formation.
Figure 6D:
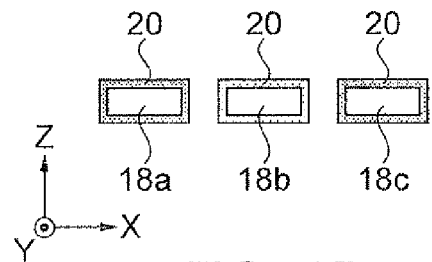
FIG. 6D is a cross-sectional view corresponding to FIG. 6A.
Figure 6B:
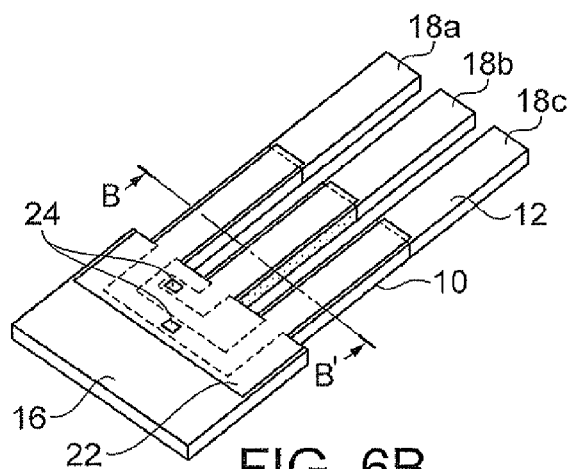
FIG. 6B is a perspective view for schematically showing the flexural vibration piece and showing a process of electrode formation.
Figure 6E:
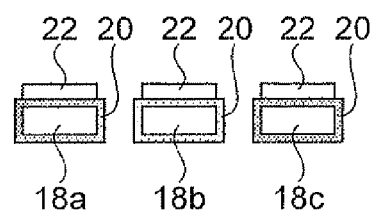
FIG. 6E is a cross-sectional view corresponding to FIG. 6B.
Figure 6C:
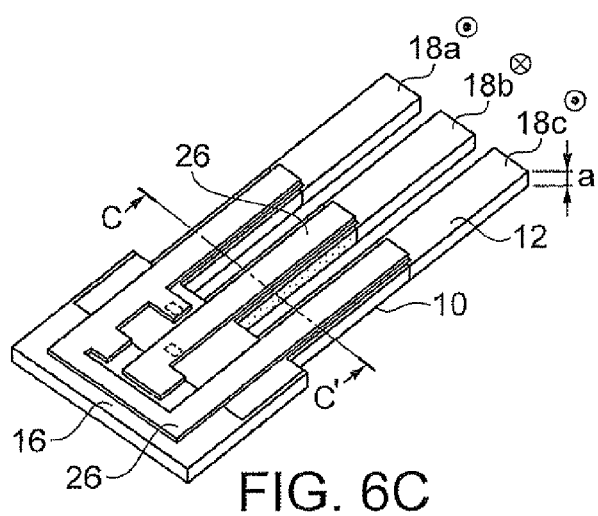
FIG. 6C is a perspective view for schematically showing the flexural vibration piece and showing a process of electrode formation.
Figure 6F:
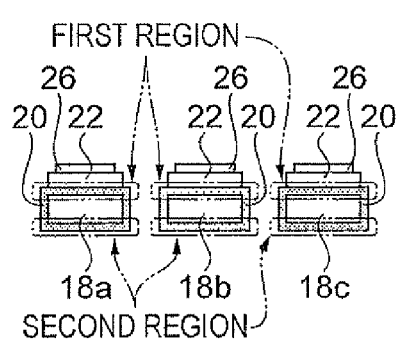
FIG. 6F is a cross-sectional view corresponding to FIG. 6C.
Figure 7:
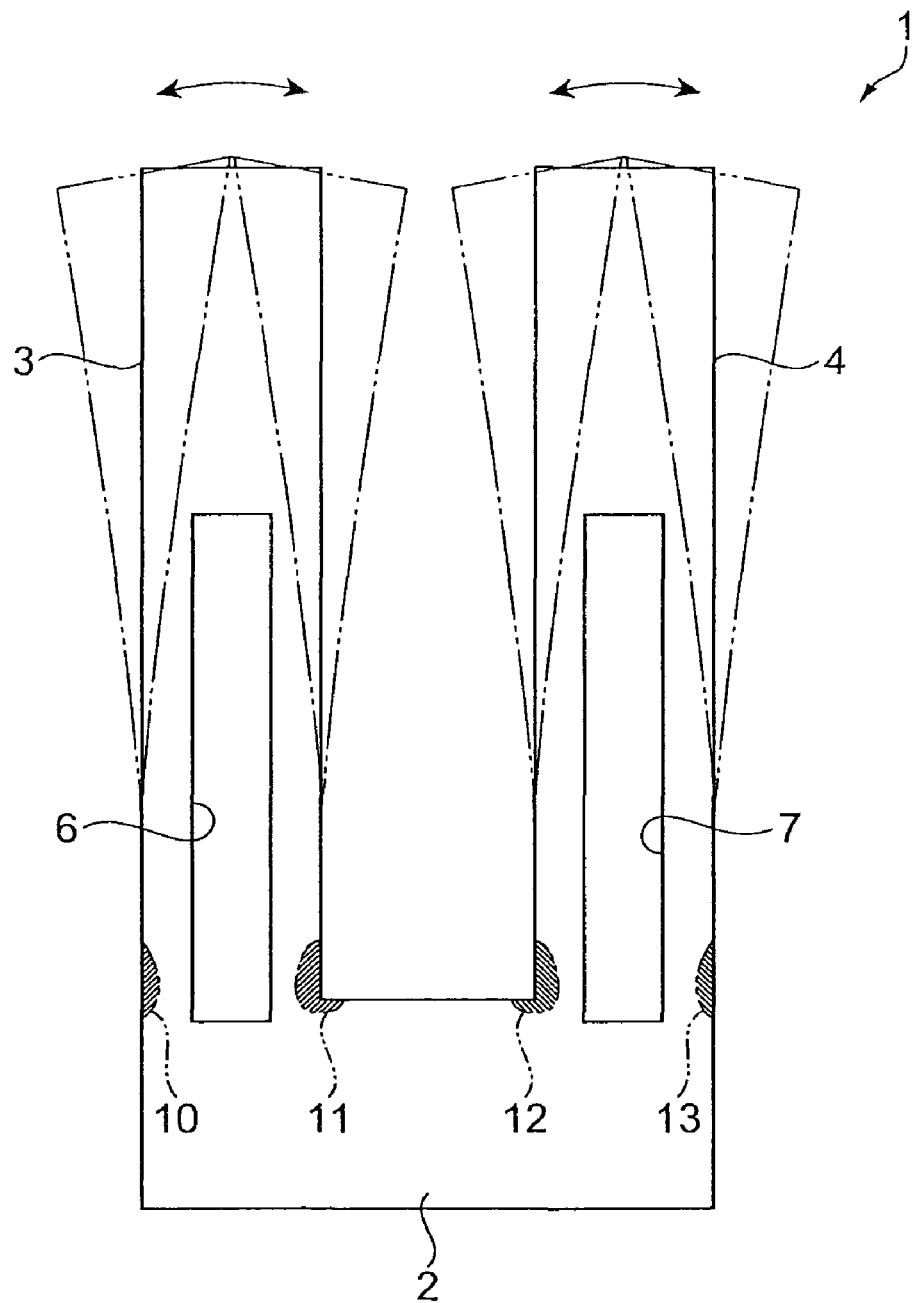
FIG. 7 is a plan view showing a typical example of a related-art tuning fork-type quartz vibration piece.

A specific example of a flexural vibration piece having three or more vibration arms will be described below. FIGS. 6A to 6F are schematic configuration views of a flexural vibration piece having three vibration arms. FIGS. 6A to 6C are perspective views showing the process of electrode formation. FIG. 6D is a cross-sectional view taken along line A-A' in FIG. 6A. FIG. 6E is a cross-sectional view taken along line B-B' in FIG. 6B. FIG. 6F is a cross-sectional view taken along line C-C' in FIG. 6C.

As shown in FIGS. 6A to 6F, a piezoelectric element 10 includes a base 16 formed of a quartz substrate and three vibration arms 18a, 18b, and 18c extending from one end side of the base. The vibration arms 18a, 18b, and 18c include a lower electrode 20 arranged on a main surface 12, a piezoelectric film 22 arranged on the lower electrode 20, and an upper electrode 26 arranged on the piezoelectric film 22. The vibration arms 18a and 18c and the vibration arm 18b alternately perform flexural vibration vertically. In other words, it can be said that they perform flexural vibration in a direction orthogonal to a plane on which the base 16 and the vibration arms 18a, 18b, and 18c are formed. A width a of the vibration arm of this example in a vibration direction is a thickness direction of the vibration arm.

As shown in FIGS. 6A and 6D in this example, the lower electrode 20 is first formed so as to cover the outer surface of the vibration arms 18a, 18b, and 18c. Next as shown in FIGS. 6B and 6E, the piezoelectric film 22 is formed so as to cover parts of the lower electrode and the base 16, and openings 24 for continuity connection between the lower electrode 20 and the upper electrode 26 are formed. Next as shown in FIGS. 6C and 6F, the upper electrode 26 is formed on the piezoelectric film 22. In this case, the lower electrode 20 of the vibration arms 18a and 18c and the upper electrode 26 of the vibration arm 18b are connected to each other, and the upper electrode 26 of the vibration arms 18a and 18c and the lower electrode 20 of the vibration arm 18b are connected to each other. In this example, the lower electrode 20 is formed of an electrode material having a thermal conductivity higher than that of a quartz substrate.

Due to the flexural vibration, in the connections between the base 16 and the vibration arms 18a, 18b, and 18c, a compressive stress and a tensile stress occur on the front and rear surfaces of the vibration arms 18a, 18b, and 18c in the root portions in the vibration direction. Description will be made in detail on the vibration arms in the drawing. When the vibration arms 18a and 18c perform flexural vibration in the +Z-axis direction, a compressive stress acts on a first region on the front surface of the vibration arms 18a and 18c to increase temperature, and a tensile stress acts on a second region on the rear surface to decrease temperature. On the other hand, the vibration arm 18b performs flexural vibration in the −Z-axis direction. A tensile stress acts on the first region on the front surface of the vibration arm 18b to decrease temperature, and a compressive stress acts on the second region on the rear surface to increase temperature. In this manner, inside the respective connections of the vibration arms 18a, 18b, and 18c with the base 16, a temperature gradient is generated between the portion on which a compressive stress acts and the portion on which a tensile stress acts. The gradient changes in direction depending on the vibration direction of the vibration arms 18a, 18b, and 18c. Due to the temperature gradient, heat conducts from the portion on the compression side to the portion on the tensile side, that is, from the high-temperature side to the low-temperature side. In the tuning fork-type quartz vibration piece of this example, the heat conduction from the portion on the compression side to the portion on the extension side is performed by using parts of the lower electrode 20 formed on the front surface of the vibration arms 18a, 18b, and 18c as heat conduction paths.

In this example, the piezoelectric film or the upper electrode is formed only on the front surface of the vibration arm. However, in the same manner as the lower electrode, the piezoelectric film or the upper electrode may be formed on the entire outer surface of the vibration arm to use the piezoelectric film or the upper electrode as the heat conduction path.

Although the first and second embodiments and the modification have described the tuning fork-type quartz vibration pieces 50, 150, and 250 formed of quartz as an example of flexural vibration piece, the tuning fork-type quartz vibration piece may be a flexural vibration piece formed of a piezoelectric substrate other than a quartz substrate.

The base material of a flexural vibration piece is not restricted to a piezoelectric substrate. The configuration and effect of the invention can be achieved not only in a piezoelectrically-actuated flexural vibration piece using a piezoelectric substrate but also in an electrostatically-actuated flexural vibration piece using static electricity force or a magnetically-actuated flexural vibration piece using magnetism.

The entire disclosure of Japanese Patent Application No. 2009-073739, filed Mar. 25, 2009 and No. 2010-002669, filed Jan. 8, 2010 are expressly incorporated by reference herein.

What is claimed is:

1. A flexural vibration piece comprising:
a flexural vibrator that has a first region on which a compressive stress or a tensile stress acts due to vibration and a second region having a relationship in which a tensile stress acts thereon when a compressive stress acts on the first region and a compressive stress acts thereon when a tensile stress acts on the first region, and performs flexural vibration in a first plane; and
a heat conduction path, between the first region and the second region, that is formed of a material having a thermal conductivity higher than that of the flexural vibrator and thermally connects between the first region and the second region, wherein
when m is the number of heat conduction paths, $\rho_{th}$, is a thermal resistivity of the heat conduction path, $\rho_v$ is a thermal resistivity of the flexural vibrator, $t_v$ is a thickness of the flexural vibrator in a direction orthogonal to the first plane, and $t_{th}$ is a thickness of the heat conduction path, a relationship of $t_{th} \geq (1/m) \times t_v \times (\rho_{th}/\rho_v)$ is satisfied.

2. The flexural vibration piece according to claim 1, wherein
the heat conduction path is formed on an outer surface of the flexural vibration piece.

3. The flexural vibration piece according to claim 1, wherein
when fr is a mechanical oscillation frequency of the flexural vibrator, $f_{20}$ is a thermal relaxation frequency of the flexural vibration piece, n is a ratio of the circumference of a circle to its diameter, k is a thermal conductivity of a material used for the flexural vibrator in a vibration direction, ρ is a mass density of the material used for the flexural vibrator, $C_p$ is a heat capacity of the material used for the flexural vibrator, a is a width of the flexural vibrator in the vibration direction, and $f_0 = \pi k/(2\rho C_p a^2)$, a relationship of $1 > fr/(f_0 + (f_{20} - f_0)/3)$ is satisfied.

4. The flexural vibration piece according to claim 1, wherein
when fr is a mechanical oscillation frequency of the flexural vibrator, π is a ratio of the circumference of a circle to its diameter, k is a thermal conductivity of a material used for the flexural vibrator in a vibration direction, ρ is a mass density of the material used for the flexural vibrator, $C_p$ is a heat capacity of the material used for the flexural vibrator, a is a width of the flexural vibrator in the vibration direction, and $f_0 = \pi k/(2\rho C_p a^2)$, $1 \geq fr/f_0$.

5. The flexural vibration piece according to claim 1, wherein
the heat conduction path is formed of part of an excitation electrode formed on the flexural vibrator.

6. The flexural vibration piece according to claim 1, wherein
the heat conduction path is formed of a non-conducting material.

7. An oscillator at least comprising:
the flexural vibration piece according to claim 1; and
an oscillator circuit that drives the flexural vibration piece.

* * * * *

UNITED STATES PATENT AND TRADEMARK OFFICE
CERTIFICATE OF CORRECTION

PATENT NO. : 8,362,854 B2
APPLICATION NO. : 12/729759
DATED : January 29, 2013
INVENTOR(S) : Makoto Furuhata et al.

It is certified that error appears in the above-identified patent and that said Letters Patent is hereby corrected as shown below:

On the title page, item 73

Please delete the following:

"Assignees:   Epson Toyocom Corporation, Tokyo (JP);
              Seiko Epson Corporation, Tokyo (JP)"

And replace with:

Assignee:    Seiko Epson Corporation, Tokyo (JP)

Signed and Sealed this
Ninth Day of August, 2016

Michelle K. Lee
*Director of the United States Patent and Trademark Office*